United States Patent [19]

Mathisen

[11] 3,999,866
[45] Dec. 28, 1976

[54] WAFER TEST SYSTEM WITH INTEGRATED CALIBRATION

[75] Inventor: Einar Skau Mathisen, Poughkeepsie, N.Y.

[73] Assignee: International Business Machines Corporation, Armonk, N.Y.

[22] Filed: June 27, 1975

[21] Appl. No.: 590,778

[52] U.S. Cl. .............................. 356/244; 356/161; 356/212; 356/243

[51] Int. Cl.$^2$ ...................................... G01N 21/22

[58] Field of Search .......... 356/108, 161, 212, 244, 356/243; 250/560

[56] References Cited
UNITED STATES PATENTS 3,645,626  2/1972  Druschel ...................... 356/212 X Primary Examiner—John K. Corbin
Assistant Examiner—Matthew W. Koren
Attorney, Agent, or Firm—D. R. McKechnie

[57] ABSTRACT

A thin flat circular silicon wafer is mounted or supported by a wafer holder mounted on an X-Y table. Motive means drives the table in two different linear directions so as to selectively position different areas of the wafer beneath a test probe. A plurality of wafer chips are also mounted on the table at different positions locatable beneath the test probe. Each of the wafer chips has different characteristics suitable for use in calibrating the test system. The wafer chips are located at predetermined positions relative to a reference position so that the table can be automatically moved during calibration to present the wafer chips to the test probe.

7 Claims, 2 Drawing Figures

WAFER TEST SYSTEM WITH INTEGRATED CALIBRATION

BACKGROUND OF THE INVENTION

1. Field of the Invention

This invention relates to a wafer test system having integrated calibration apparatus and, more particularly, to a test system for measuring the thickness of thin films on silicon wafers which system includes at least one calibration chip having surface characteristics suitable for use in calibrating the apparatus.

2. Prior Art

Disclosed in U.S. Pat. 3,751,643 — Dill et al. is a spectrophotometer suitable for use in measuring the thickness of thin films deposited on a substrate such as one made of silicon. In the course of operation of the system, it is necessary to calibrate the system by using a standard or sample having known transmission or reflective characteristics where the sample may be of bare silicon. In accordance with the prior art, the sample would be of substantially the same size as that of the wafers to be tested and would first be placed in position relative to the test probe. The calibration measurements are made, and thereafter test wafers can be placed next to the test probe.

SUMMARY OF THE INVENTION

One of the objects of the invention is to provide a wafer test system that is operable in a mode so as to automatically calibrate the test system.

Another object of the invention is to provide a wafer test system in which a wafer is moved in a plane beneath a test probe so as to bring different areas of the wafer beneath the probe, and wherein a chip or piece of a standard wafer is also mounted for movement to a position beneath the test probe so that the instrument can be automatically calibrated without having to separately handle both a test wafer and a standard wafer.

Still another object of the invention is to provide a wafer test system calibration apparatus in which a plurality of wafer chips are mounted at different positions for movement beneath a test probe and wherein each of the wafer chips has different surface characteristics for use in calibrating and checking the accuracy of the system.

Briefly, the manner in which these and other objects of the invention are obtained is to provide a test system in which an X-Y table supports a wafer holder adapted to receive a test wafer. The X-Y table is selectively actuated to position different areas of the test wafer beneath a test probe for measurement of thickness at such areas. Also mounted on the table is at least one wafer chip that is spaced from the position or location of the test wafer substantially coplanar therewith so that it can be moved by selective actuation of the X-Y table to a position beneath the test probe for calibration of the system.

The foregoing and other objects, features and advantages of the invention will be apparent from the following more particular description of a preferred embodiment of the invention, as illustrated in the accompanying drawings wherein.

DETAILED DESCRIPTION

Figure 1:
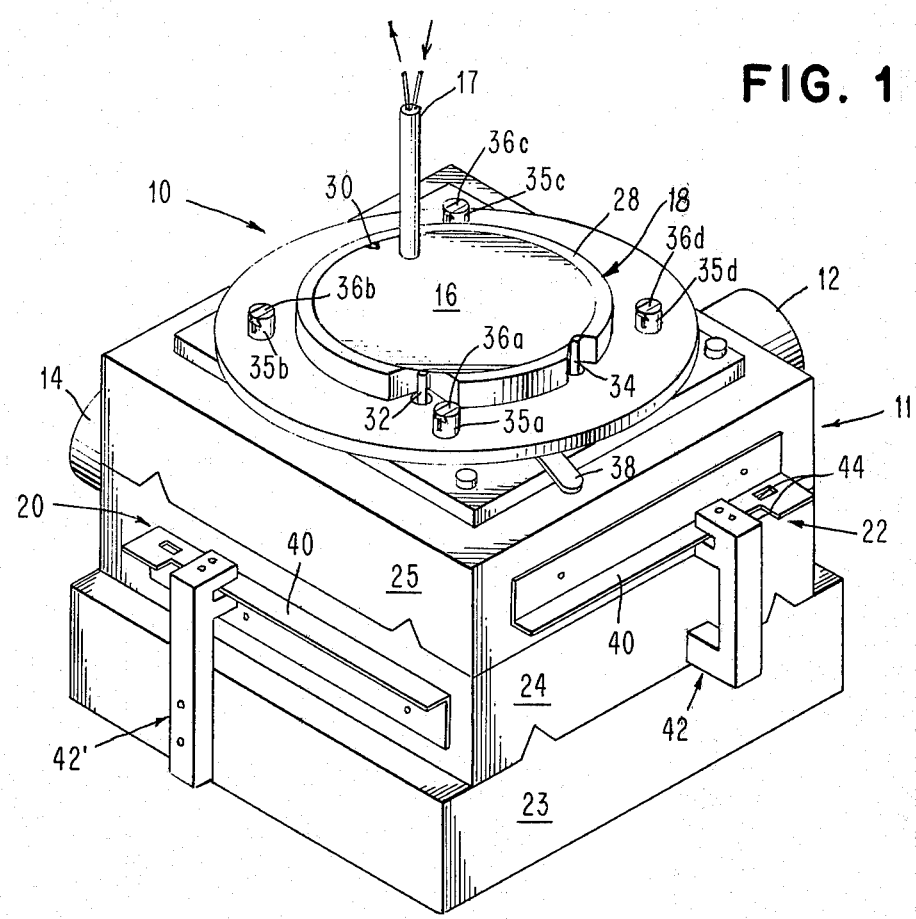
FIG. 1 is a perspective view of part of a wafer test system embodying the invention.

Referring now to FIG. 1, the test system, preferably of a type including a spectral analyzer similar to that disclosed in the aforementioned U.S. Pat. No. 3,751,643, includes an article handler 10 having an X-Y table 11 driven in two mutually perpendicular directions by a pair of reversible, digitally actuated stepping motors 12 and 14. The specific purpose of the article handler shown is to position a flat circular silicon test wafer 16 of the type used to manufacture semiconductor devices, beneath a stationary fiberoptic test probe 17. Wafer 16 is supported by a wafer holder 18 mounted on top of X-Y table 11. A pair of devices 20 and 22 are mounted on the table to sense, detect or define zero or reference positions, these devices being referred to hereafter simply as zero sensors.

Table 11 may be any conventional commercially available X-Y table. As shown, it comprises a stationary base 23, a first member 24 mounted upon base 23 for movement in a first direction, and a second movable member 25 mounted upon member 24 for movement relative thereto at right angles to the direction of movement of member 24 relative to base 23. Member 24 is arbitrarily considered to be movable in the Y direction and therefore member 25 moves in the X direction. With such directions, then motor 14 is the Y motor, motor 12 is the X motor and sensors 20 and 22 are respectively Y and X zero sensors.

Wafer holder 18 comprises a plate assembly 28 mounted on top of member 25, the upper portion of assembly 18 supporting wafer 16. If desired, plate assembly 28 may be provided with a multiplicity of holes connected to a vacuum source to aid in holding wafer 16 down. A fixed upstanding stud 30 engages a positioning notch in the edge of wafer 16 and cooperates with two relatively movable studs 32 and 34 for locating wafer in proper position atop holder 18. A spring biased handle 38 is biased in a direction which tends to move studs 32 and 34 towards stud 30 and thereby clamp wafer 16 therebetween. Movement of handle 38 against the bias moves studs 32 and 34 outwardly and allows a wafer to be either removed or placed upon holder 18.

Figure 2:
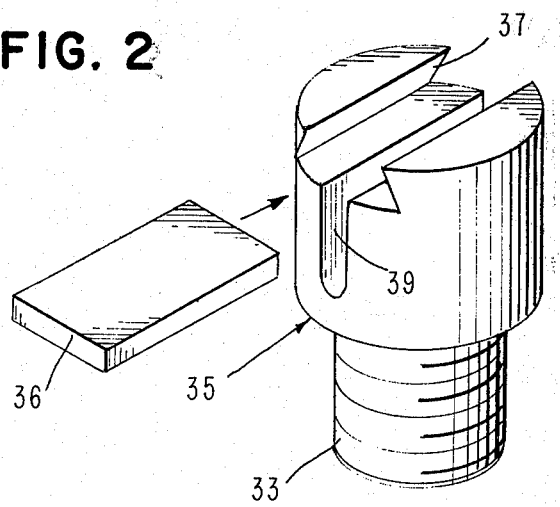
FIG. 2 is a perspective view of a wafer chip and calibration stud prior to assembly.

Mounted on table 11 are four calibration studs 35 a-d which support four wafer chips 36 a-d in the plane of wafer 16. The studs are located at fixed, known or predetermined positions relative to the zero positions of table 11 so that the chips 36 can be respectively and selectively positioned beneath probe 17. Each stud 36 includes, as shown in FIG. 2, a lower threaded portion 33 for mounting, and a cylindrical upper portion having an upwardly opening dovetailed slot 37 for receiving a chip 36. The chip is of such a size that it can be wedged or press fitted into slot 37 and is removable therefrom by means of a bladed tool (not shown) that fits in a slot 39 intersecting slot 37 whereby the tool can be used to push chip 36 out of the stud. For calibration, chip 36a has a bare silicon surface of known reflectance characteristics and chips 36 b-d have different films of different thicknesses deposited on silicon substrates. Once the system is calibrated by using chip 36a, the remaining chips can be ued to test the accuracy of the system.

The purpose of sensors 20 and 22 is to establish a reference position for locating the wafer chips 36 for calibration purposes and for locating different areas of wafer 16 for test measurements. It should be obvious that any form of conventional locating mechanisms commonly used for X-Y tables, can be used. In the embodiment shown, each zero sensor is similar so that only one need be described in any detail. Zero sensor 22 comprises a metallic opaque interrupter plate 40 mounted on member 25 for movement therewith and an electro-optical assembly 42 mounted on member 24 for movement therewith. Plate 40 extends through assembly 42 and has a pair of edges 44 that are laterally aligned and cooperate with an optical detector in assembly 42 to define the zero position. When edges 44 are aligned in housing 42, the zero position is established by means of electrical signals generated by assembly 42. The particular or specific details of the zero sensors form no part of the present invention and are claimed in copending application Ser. No. 599,774, filed June 27, 1975, by J. J. Erickson et al for "Article Positioner With Zero Position Sensing Means", and assigned to the assignee of the present invention.

It is intended that the test system includes some form of a conventional controller or data processing system for furnishing various commands to the X-Y table and to the instrument associated with probe 17 in order to operate the system. The commands for movement would furnish data telling how far and in which direction the X-Y table 11 is to be moved. In the overall operation of the system, table 11 is first moved to a positive position and then is moved far enough in the negative direction to insure actuation of zero sensors 20 and 22, to establish the zero position. Once this is done, further commands can be issued causing the X-Y table 11 to position wafer chip 36a beneath the test probe 17 to first calibrate the system. Then selected ones of the additional wafer chips 36 b-d can be selectively positioned to further test the accuracy of a system. Thereafter, the test wafer 16 can be positioned beneath probe 17 for the purpose of taking measurements. It may be desirable to include limit switches (not shown) to prevent damage to the X-Y table.

While the invention has been particularly shown and described with reference to a preferred embodiment thereof, it will be understood by those skilled in the art that various changes in form and details may be made therein without departing from the spirit and scope of the invention.

What is claimed is:

1. In a test system having a wafer handling system comprising an X-Y table and motive means for selectively moving said table with two degrees of freedom of movement to predefined positions, the combination comprising:
    a wafer holder mounted on said table for movement therewith, said wafer holder being adapted to support a flat wafer for movement in the plane of the wafer;
    first and second calibration studs mounted on said table adjacent to but spaced from the location of a wafer and from each other;
    a first wafer chip mounted on said first calibration stud, said first wafer chip being composed of bare silicon for use in calibrating said test system;
    and a second wafer chip mounted on said second stud and having a thin film of known thickness deposited on a silicon substrate.

2. The combination of claim 1 wherein said wafer chips are flat and are mounted on said studs in said plane of the wafer.

3. The combination of claim 1 wherein:
    each of said calibration studs comprises a slot into which said wafer chip mounted thereon is wedged.

4. The combination of claim 1 comprising:
    means establishing reference points for movement of said table;
    and each calibration stud is mounted at a predetermined position relative to each reference point.

5. In a system for measuring the thickness of a film deposited on a flat test wafer including a motor driven, incrementally movable X-Y table for moving and positioning said test wafer beneath a stationary optical test probe operative to project light onto said wafer and collect light reflected from said wafer, the combination comprising:
    a wafer holder mounted on said table for movement therewith, said holder being adapted to receive and support a test wafer whereby movement of said X-Y table selectively positions such test wafer relative to said test probe;
    a flat wafer chip having surface characteristics suitable for use in calibration of the test system;
    and means mounting said wafer chip on said table at a predetermined position relative thereto which position is spaced from the position of a test wafer and is substantially coplanar therewith, whereby said wafer chip can be selectively positioned beneath said test probe while a test wafer is in said wafer holder.

6. The combination of claim 5 wherein:
    said mounting means comprises a dove-tailed slot, said wafer chip being wedged in said slot.

7. The combination of claim 6 wherein:
    said mounting means further comprises a second slot intersecting said dove-tailed slot for receiving a tool for moving said wafer chip.

* * * * *